United States Patent
Matsumoto et al.

[11] Patent Number: 5,955,212
[45] Date of Patent: Sep. 21, 1999

[54] SUPERHARD FILM-COATED MEMBER AND METHOD OF MANUFACTURING THE SAME

[75] Inventors: Yasushi Matsumoto; Kazuhito Nishimura; Hiroshi Tomimori; Akio Hara, all of Sakai, Japan

[73] Assignee: Osaka Diamond Industrial Co., Ltd., Osaka, Japan

[21] Appl. No.: 08/256,788

[22] PCT Filed: Dec. 8, 1993

[86] PCT No.: PCT/JP93/01779

§ 371 Date: Oct. 28, 1994

§ 102(e) Date: Oct. 28, 1994

[87] PCT Pub. No.: WO94/13852

PCT Pub. Date: Jun. 23, 1994

[30] Foreign Application Priority Data

Dec. 8, 1992 [JP] Japan .................................. 4-351955

[51] Int. Cl.⁶ .............................. C23C 16/00; B23B 3/00
[52] U.S. Cl. .......................... 428/698; 427/249; 427/255; 427/255.7; 427/318; 427/419.7; 428/627
[58] Field of Search .................................. 427/249, 255, 427/318, 255.7, 399, 419.7; 428/457, 698, 627

[56] References Cited

U.S. PATENT DOCUMENTS 4,988,421  1/1991  Drawl et al. ............................. 427/249

FOREIGN PATENT DOCUMENTS

| 62-67174 | 3/1987 | Japan . |
| 63-1280 | 1/1988 | Japan . |
| 63-53269 | 3/1988 | Japan . |
| 63-100182 | 5/1988 | Japan . |
| 63-20911 | 5/1988 | Japan . |
| 1242491 | 9/1989 | Japan . |
| 3146663 | 6/1991 | Japan . |
| 3219079 | 9/1991 | Japan . |
| 596401 | 4/1993 | Japan . |

*Primary Examiner*—Janyce Bell
*Attorney, Agent, or Firm*—Cushman Darby & Cushman IP Group of Pillsbury Madison & Sutro LLP

[57] ABSTRACT

The present invention provides a superhard film-coated member having a diamond or diamond-like carbon film strongly bonded to a cemented carbide substrate and a method of manufacturing such a member. The cemented carbide substrate is subjected to heat treatment to cause the bonding metal in a region of the substrate near to its surface to migrate to the surface so as to form hemispherical deposits thereon. The deposits are left undisturbed or a part or all thereof are removed, and subsequently diamond and/or diamond-like carbon is grown on the substrate surface by a chemical vapor deposition process. The deposits formed on the substrate surface have the effect of significantly improving the bonding strength between the superhard films and the cemented carbide substrate to allow formation of thicker film coatings.

16 Claims, 15 Drawing Sheets

2μm

10 μm

1 μm

50μm

50μm

50μm

100 μm

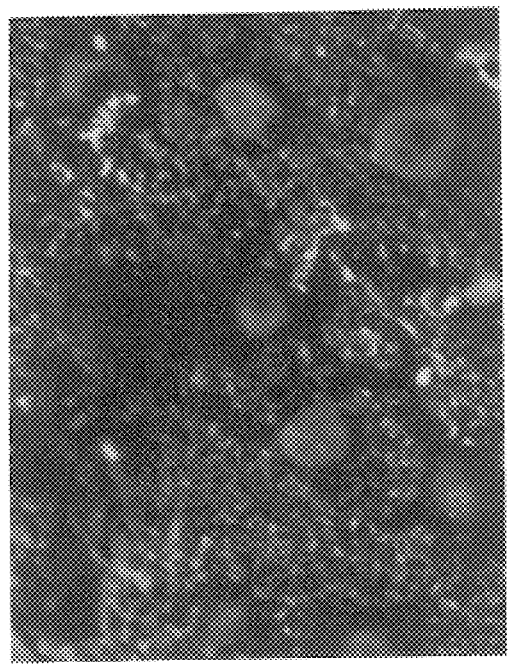
FIG. IIa
FIG. IIb
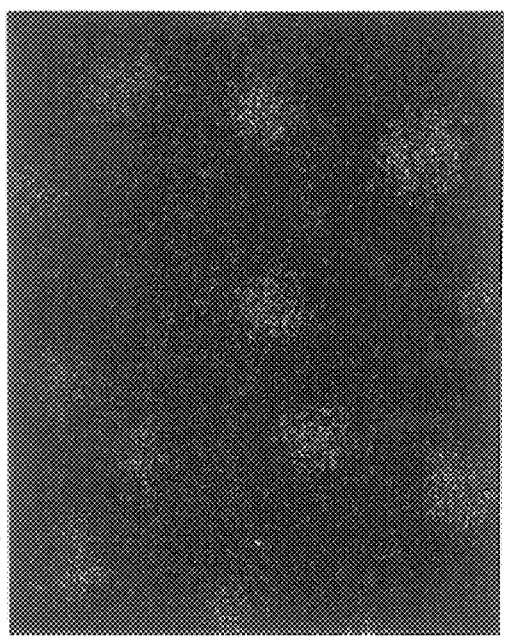
FIG. IIc
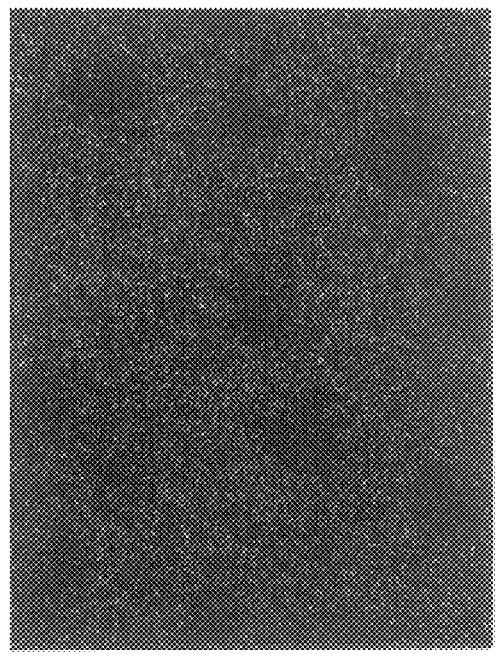

200μm

200μm

SUPERHARD FILM-COATED MEMBER AND METHOD OF MANUFACTURING THE SAME

BACKGROUND OF THE INVENTION

1. Field of the Invention

The present invention relates to a superhard film-coated member for use in cutting or wear resistant tools, wear resistant parts and components, optical parts and components, electronic materials and the like, which is produced by forming a film of diamond and/or diamond-like carbon on the surface of a cemented carbide substrate by a chemical vapor deposition process. The term "superhard film" herein referred to shall generally mean films formed of diamond and/or diamond-like carbon.

2. Description of the Related Art

Chemical vapor deposition ("CVD"), in providing diamond coating on the surface of a cemented carbide substrate, tends to produce amorphous carbon on the cobalt in the bonding phase (hereinafter also referred to as "bonding cobalt", and such bonding cobalt and like metals in the bonding phase as "bonding metals"), which hinders formation of diamond. As one solution to this problem, the prior art, exemplified by Japanese Patent Publication No. Sho 63-20911, discloses that acid etching the substrate to remove the bonding metal to a predetermined depth from its surface has the effect of allowing formation of the diamond film thereon and remarkably improving the bonding strength between the diamond film and the substrate.

Further, Japanese Patent Publication Laid-Open No. Sho 63-100182 discloses that a cemented carbide of which the content of bonding cobalt is reduced by about 1 to 4% by weight is suitably used as a substrate for diamond coating, but that for diamond film formation such a low-cobalt cemented carbide still requires acid etching to have its bonding cobalt removed.

Alternatively, Japanese Patent Publication Laid-Open No. Sho 62-67174 discloses several methods of bonding metal removal, including dry etching the substrate in a plasma of carbon fluoride, sputter etching with hydrogen, argon gas, etc., in addition the aforementioned method of using an acid.

There has been proposed a formation of an intermediate layer to improve the bonding strength between the diamond film and the substrate without removing the bonding phase as described above. For example, Japanese Patent Publication Laid-Open No. Sho 63-1280 discloses forming on the surface of a cemented carbide or a like substrate a layer of a carbide, nitride, boride, etc. of an element of Group IVa, Va or VIa of the periodic table, or a compound or a mixture of these, and then providing a diamond film on the thus formed layer.

Also, as to the thickness of the superhard film coating, Japanese Patent Publication Laid-Open No. Hei 1-212491 describes that a thickness exceeding 20 micrometers is not desirable because the thicker film coating will delaminate due to thermal stresses occurring in the coating.

As described hereinabove, many proposals have been made for improving the bonding strength of the diamond film to the substrate, however no suitable methods which assure satisfiable quality and are adapted for industrial production have been found yet. Accordingly, a need still exists for such a suitable method.

In other words, since a cemented carbide subjected to acid etching has the bonding metal thereof removed from its surface layer, WC (tungsten carbide) particles existing in the interface between the substrate and the diamond film are not always firmly retained at their fixed positions (in a case using WC as the substrate). A diamond film formed on such an interface cannot have a sufficient bonding strength, and thus the resultant cutting tools are limited in their usage to cutting of low (below 12%) silicon-aluminium alloys, graphite, carbon fiber-reinforced plastics, green ceramics, etc. That is, such cutting tools are inappropriate for interrupted cutting of 18–20% Si—Al alloys, heavy-duty cutting such as high feed cutting, and deep cutting over a prolonged period of time.

In addition, if a diamond film grows to a thickness close to 15 micrometers on an acid etched cemented carbide, it will delaminate. Thus, the prior art process provides for only a diamond film having a thickness in the range of about 0.1 to 5 micrometers because of concerns over such delamination; consequently the resultant tools will have their substrates exposed before their flank wears (Vb), used as a measure of tool life, reach a predetermined amount, even if delamination of the diamond film could be avoided. Thus, the resultant tools will inevitably have a limited useful life.

Accordingly, the present invention solves the foregoing problems of the prior art by providing an improved cemented carbide coated with a superhard film having a high bonding strength, the film being allowed to grow thicker to produce a superhard film-coated cemented carbide with a longer life, and by providing an improved and novel method for producing such a diamond-coated cemented carbide.

SUMMARY OF THE INVENTION

The inventors have undertook a series of studies with the objective of permitting a cemented carbide substrate to be coated with a superhard film by heat-treating the substrate without using the above described acid etching process to remove the bonding metal from the substrate. It is also an objective to provide such a coating of greater thickness having a high bonding strength by making the coefficient of thermal expansion at the surface of the substrate closer to that of diamond. These studies have revealed the following:

1) Heat-treating the cemented carbide substrate once or repeatedly will produce on the surface of the substrate hemispherical deposits mainly composed of the bonding metal.

2) If the substrate is pretreated by repeating the foregoing heat treatment at least one time, followed by formation of the superhard film on its surface, the resultant coated cemented carbide can have a superhard film thicker than 20 micrometers with a high bonding strength.

3) Heat-treating the substrate in an atmosphere containing carbon atoms will produce on its surface hemispherical deposits together with sediments mainly composed of carbon. Repeating the heat treatment and the removal of the sediments at least once is effective in forming on the substrate a thick superhard film having a high bonding strength.

4) The cemented carbide substrate after being passed through the heat treatment as described in the foregoing paragraphs 1) and 2) will have such a region within the depth of about 30 micrometers from the surface in which the bonding phase content is reduced and the hard phase interparticle spaces become narrower than those in non-treated substrates, so that the substrate can retain at least its original strength, which is sufficient for the manufacture of tools to be used in interrupted cutting or heavy-duty cutting such as high feed cutting and deep depth cutting. Also, the thus treated substrate will exhibit at its surface a smaller coefficient of thermal expansion, i.e., close to that of diamond 5) In the resultant superhard film-coated cemented carbide, the structure of the aforementioned surface of the heat-treated substrate and the existence of the deposits at the interface of the superhard film and such a substrate effectively improve the bonding strength therebetween.

The present invention has been achieved based on these findings set forth in the foregoing paragraphs 1) through 5), which will be described hereinafter in greater detail with reference to the accompanying drawings.

The present invention set forth hereinbefore in the form of conceptual means to solve the prior art problems as well as the preferred examples (best mode for carrying out the invention). to be described hereinbelow use as a representative base material or substrate commercially-available general-purpose cemented carbide typically represented by WC—Co based alloys. However, the present invention is practicable by using as the base material or substrate other cemented carbides such as those containing free carbon, sintered carbon, or those containing a bonding metal other than cobalt. Also, in the processes shown in the preferred examples, there may be added any known or new process steps, such as scratching the substrate surface prior to the film formation process (5) to be described hereinlater. Especially, for cemented carbide having surface roughness of 0.2 $\mu$mRa or less, it is essential to apply the scratching process prior to heat treatment.

BRIEF DESCRIPTION OF THE DRAWINGS

FIGS. 11a, 11b and 11c are analytically enlarged views of FIG. 10, respectively;

DESCRIPTION OF THE PREFERRED EMBODIMENTS

Two groups of cemented carbide substrates as specimens were subjected to the following preferred series of processes. The first group comprised commercially available cemented carbide tips of WC-4% Co, while the second group comprised commercially available cemented carbide tips of WC-25% Co. 1. Heat treatment→2. Soot removal→3. Heat treatment→4. Soot removal→5. Film formation→6. Grinding and polishing Each process will be described hereinlater, with the major process conditions given below: Heat treatment (1, 3)

Figure 1:
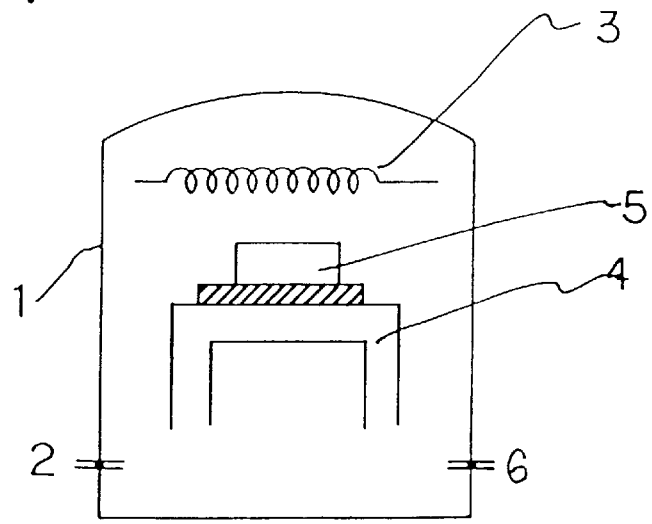
FIG. 1 is a schematic cross-sectional view of a hot filament CVD reactor used for the heat treatment and the film formation in a preferred method according to the present invention.

| Equipment used | set A - hot filament CVD reactor shown in FIG. 1<br>set B - gas carburizing furnace | |
|---|---|---|
| | set A | set B |
| Gas composition | $H_2$ - 1% $CH_4$ | $H_2$ - 3% $C_3H_8$ |
| Gas Pressure | 100 Torr | 1 atm |
| Substrate temperature | 900° C. | 900° C. |

Keeping time (min.) 1, 3, 5, 15, 30, 45, 90, 180, 270 (common to A and B)
Soot removal (2, 4) Soot (sediments) produced on the substrate surface was wiped off with a swab (common to all substrates).
Film formation (3) (common to all substrates)

| Equipment used | hot filament CVD reactor shown in FIG. 1 |
|---|---|
| Gas composition | $H_2$ - 1% $CH_4$ |
| Gas Pressure | 100 Torr |
| Substrate temperature | 900° C. |
| deposition time | 15 hours |

Grinding (6) (common to all specimens) ground with a #800 (30 $\mu$m) resin-bonded diamond grinding wheel
Process Details
Heat treatment (1, 3)
For heat treatment processes 1 and 3, CVD reactor was used as shown in FIG. 1 comprising a reaction vessel 1, an inlet valve 2 for introducing an atmosphere gas into the vessel 1, a tungsten filament 3 a substrate cooling holder 4, a cemented carbide substrate as a specimen to be treated, and an outlet valve for discharging the atmosphere gas from the vessel 1.

The tungsten filament was connected to 120 V AC source to be heated with 120 ampere current to a temperature ranging from about 2,150 to 2,200° C.

In the reactor, the substrate was spaced apart about 10 mm from the hot filament and maintainted at 900° C as shown above.

Figure 3:
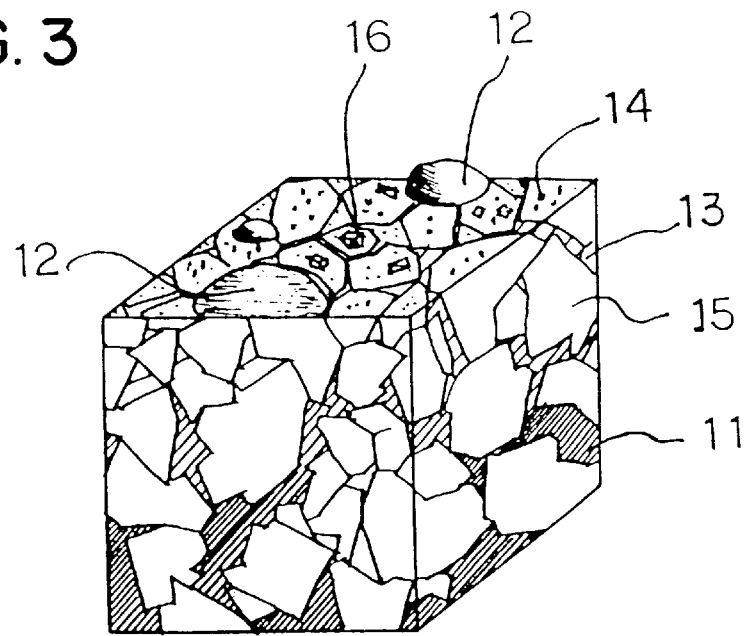
FIG. 3 is a schematic representation illustrating the structure shown in FIG. 2.
Figure 2:
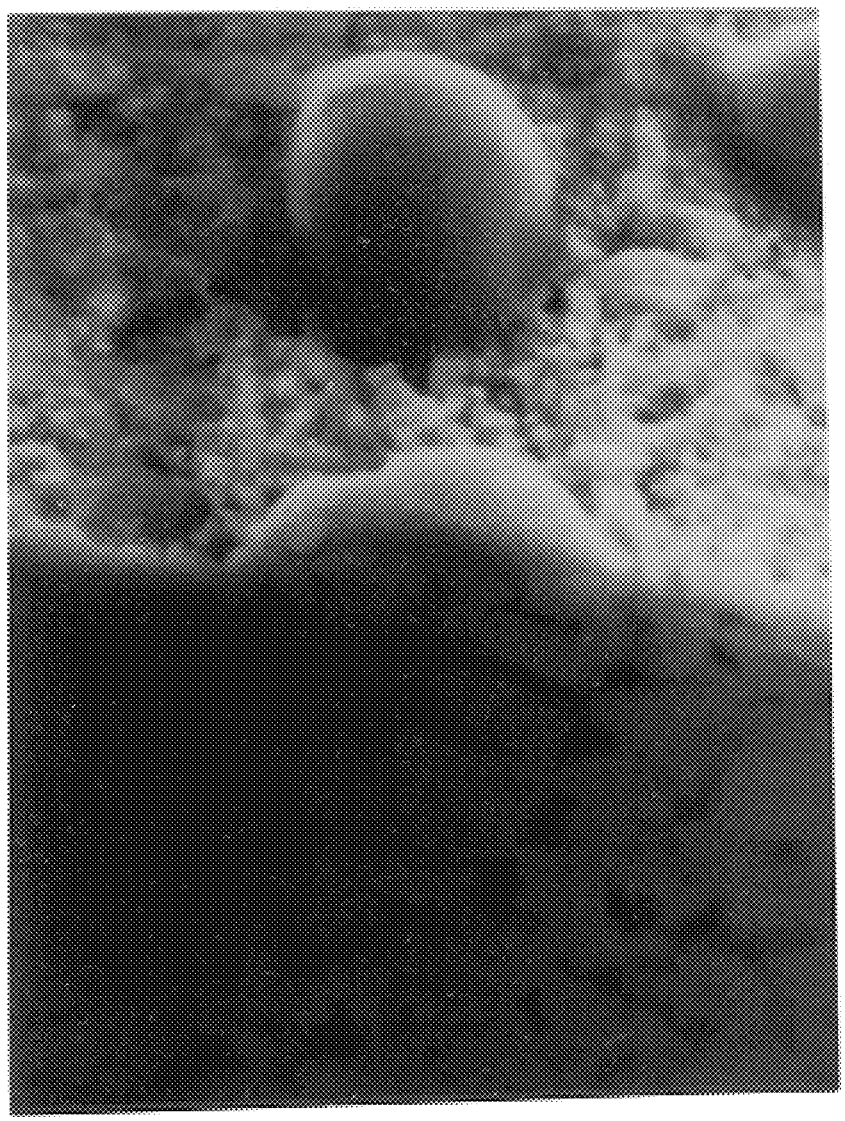
FIG. 2 is a photograph of a secondary electron image of a scanning electron microscope, showing a particulate structure on the surface of a cemented carbide substrate used in the present invention.

FIG. 2, is a photograph of a secondary electron image of a scanning electron microscope, showing partly in section a particulate structure in the surface region of a heat-treated sample of cemented carbide substrates belonging to the first group and set A, with a corresponding schematic illustration shown in FIG. 3.

As seen in FIGS. 2 and 3, the heat treatment caused bonding cobalt 11 to migrate out from the inside to deposit on the surface of the substrate, so that the bonding cobalt formed hemispherically protuberant deposits 12 without spreading over the entire surface of the substrate. Conversely, inside the substrate there remained regions 13 having their bonding metal content reduced due to such deposition.

Such regions with reduced bonding metal content were observed within about 30 micrometers deep from the surface of the substrate. In those regions, the hard phase particles 15 of WC were rearranged resulting in the particles in those regions being more closely spaced from one another than in deeper regions of the substrate.

As summarized in the following table, formation of deposits 12 and diamond film was observed on the surfaces of some specimens, with those of set A heat-treated in the CVD reactor for 10 minutes or longer all showing such formation of deposits for both the first and second groups. In FIG. 3, reference numeral 14 denotes soot sedimented on the substrate surface and reference numeral 16 is diamond formed through the aforementioned series of processes.

Formation of deposits through heat treatments and deposition of diamond films 10 $\mu$m thick

| Heat treatment time | 0 | 5 | 10 | 15 | 30 | 45 | 90 | 180 | 270 |
|---|---|---|---|---|---|---|---|---|---|
| Deposits formation | | | | | | | | | |
| First group | | | | | | | | | |
| Set A | N | N | Y | Y | Y | Y | Y | Y | Y |
| Set B | N | N | — | N | — | N | — | Y | Y |
| Second group | | | | | | | | | |
| Set A | N | N | Y | Y | Y | Y | Y | Y | Y |
| Set B | N | N | — | N | — | N | — | Y | Y |
| Set c | — | N | — | N | — | N | — | — | — |
| Film formation | | | | | | | | | |
| First group | | | | | | | | | |
| Set A | N | Y | Y | Y | Y | Y | Y | Y | Y |
| Set B | N | N | — | N | — | N | — | Y | Y |
| Second group | | | | | | | | | |
| Set A | N for all specimens |
| Set B | N for all specimens |

Note: In the table, the symbol N denotes "none" and Y denotes "present" for deposits formation, while for film formation N denotes "impossible" and Y "possible", with the symbol "—" standing for "non tested" for both items.

Soot removal (2, 4)

Sedimented soot was entirely removed from the surface of heat-treated specimens. In removing the soot, deposits 12 were left unremoved almost as they were on the surface.

The deposits were mainly composed of cobalt as a bonding metal, with slight amounts of tungsten and carbon, etc. It is desirable to remove soot or the like substances sedimented on the deposits comprising the bonding metal separated out from inside of the substrate, because such sediments hamper the growth of deposits. For the specimens of set A, two 90 minutes heat treatment processes combined with two soot removal processes were sufficient to assure formation of the deposits. The temperature of heat treatment may be selected suitably in the range of 500° to 1,300° C. in an appropriate balance with the retention time in the heat treatment equipment used. However, desirable results would be achieved with a temperature higher than that used for the succeeding film formation process.

Film formation (5)

Figure 4:
FIG. 4 is a microstructural photograph showing an initial stage of diamond deposition on the substrate surface shown in FIG. 2.
Figure 5:
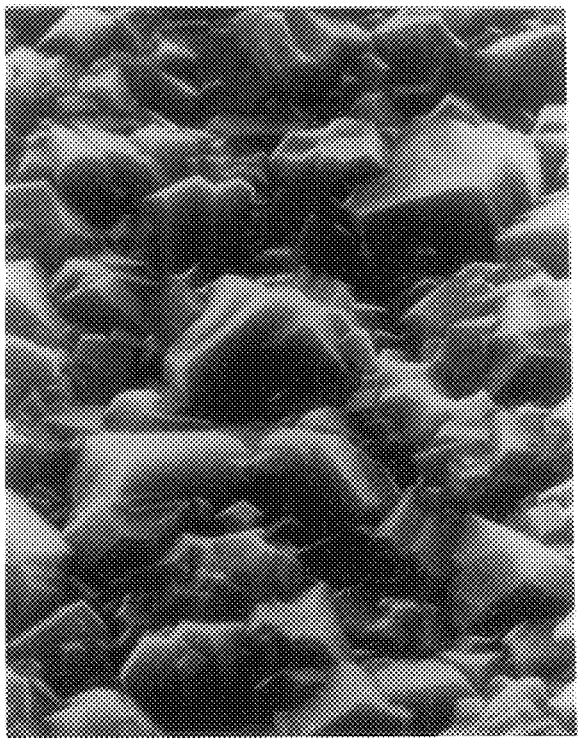
FIG. 5 is a microstructural photograph showing a state in which the diamond is further grown from the state of FIG. 4.

As understood from FIG. 4, formation of nucleation of diamond particles initially began on the peripheries of the bonding metal deposits and at portions on the substrate surface free of such deposits. Subsequently, a diamond film grows to enclose the deposits so as to cover the substrate surface.

Figure 6A:
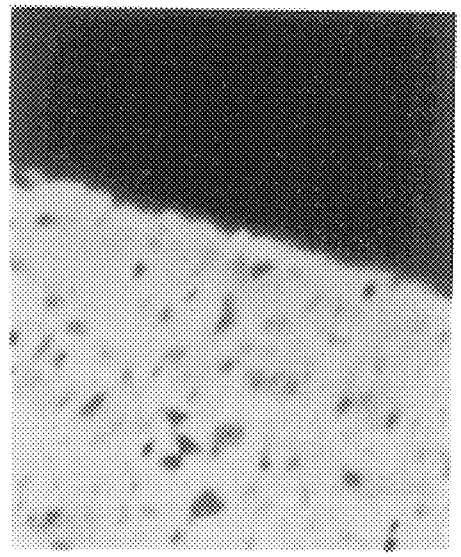
FIGS. 6a, 6b and 6c are microstructural photographs, respectively, showing a structural composition of an interface between substrate and diamond film.
Figure 6B:
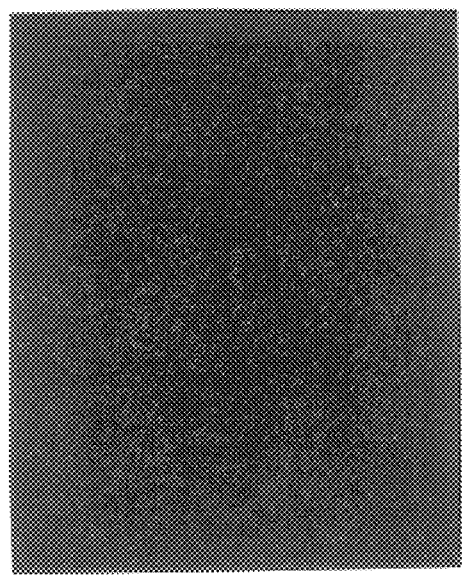
Figure 6C:

Photographs of FIGS. 6a, b and c show cross sections of interfaces between substrate and diamond film at the same location, with 6a showing a secondary electron image of scanning electron microscope, 6b an X-ray image of cobalt Kα1, and 6c an X-ray image of tungsten Lα1.

These X-ray images were taken by using the same LiF receptor. In the secondary electron image of FIG. 6a, the boundary between the substrate and the diamond film is identifiably observable. It is seen that the tungsten is definitely demarcated from the diamond, while the cobalt exists in the diamond side of the boundary. The cobalt found on the diamond side seems the trace of the aforementioned deposits. In the thickness of diamond films, the cobalt could be found within several micrometers from the surfaces of the respective substrates, namely, in a range approximately half the thickness of diamond films in the inventors' opinion.

Grinding or polishing (6)

The surface roughness of diamond-coated cemented carbide specimens was about 2 $\mu$m Ra, which could be finished to 5 nm Ra by grinding. Further, according to the present invention, it is possible to form even 30 $\mu$m or thicker diamond films on the substrate surfaces without delamination therefrom, and the resultant diamond-coated cemented carbide can be subjected to grinding. In the prior art, however, it has been impossible to form such diamond or diamond-like carbon films having a good adhesion strength to substrates, to say nothing of the grind ability of cemented carbides coated with 20 $\mu$m or thicker superhard films.

In addition to the foregoing first and second groups of substrates, a third group of substrates was prepared to be subjected to a preferred series of processes, explained below, for obtaining specimens of superhard film-coated cemented carbide. This resulted in the formation of superior film coatings, as described hereinafter.

As the third group of substrates, commercially available cemented carbide ½" square of WC-6% Co were used.

0. Pretreatment→1. heat treatment→2. soot removal→3. heat treatment→4. soot removal→5. film formation→6. grinding or polishing→7. cutting test Process Conditions Pretreatment of substrates (0)

| Scratching | #80 SIC, sand blasting |
|---|---|
| Degreasing | supersonic cleaning in acetone |

Heat treatment (1, 3)

| Equipment used | hot filament CVD reactor |
|---|---|
| Gas composition | $H_2$ - 0.6% $CH_4$ (The gas was introduced into the chamber after evacuating air by means of a rotary pump.) |
| Gas pressure | 100 Torr |
| Temperature | filament temperature 2,180° C. substrate temperature 950° C. |
| Heat treatment time | 90 min. × 3 |

Soot removal (2, 4) Soot (sediments) produced on the substrate surface was wiped off with a swab.

Film formation (5)

| Equipment used | hot filament CVD system |
|---|---|
| Gas composition | $H_2$ - 1% $CH_4$ |
| Gas pressure | 100 Torr |
| Temperature | filament temperature 2,180° C. |
| | substrate temperature 850° C. |
| Diamond deposition time | 15 hours |

Grinding (6) ground with a #800 (30 μm) resin-bonded diamond grinding wheel

Cutting test (7)

| Machine used | Lathe manufactured by Mori Seiki Co., Ltd., Japan |
|---|---|
| Work material | Al - 18% Si |
| Cutting conditions | |
| cutting speed | 800 m/min. |
| depth of cut | 0.5 mm |
| feed rate | 0.1 mm/rev. |
| | wet, continuous cutting |

Process Details

Heat treatment (1, 3)

Figure 7:
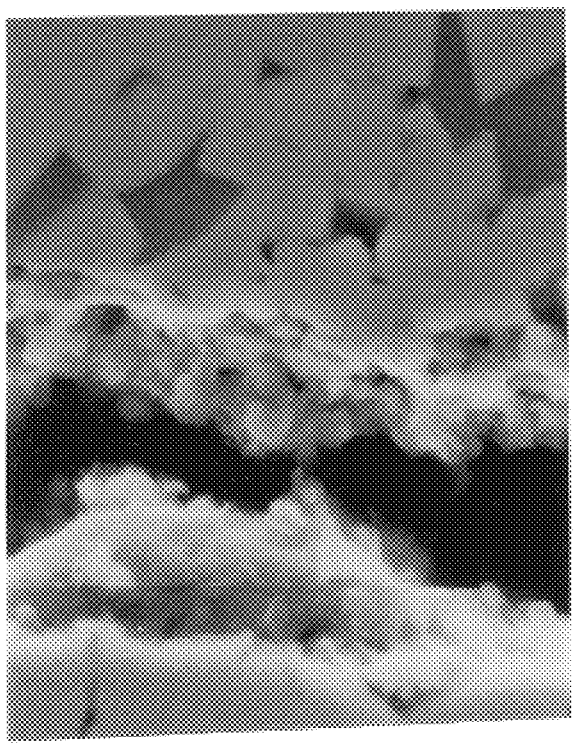
FIG. 7 is a photograph of a secondary electron image of a scanning electron microscope, comparatively showing in section two particulate structures on the surfaces of cemented carbide substrate.

FIG. 7 shows a secondary electron image of scanning a electron microscope taken to observe, in vertically opposed position to each other, two cross sections of the same heat-treated one has deposits of bonding metal and the other being free of the deposits.

In the upper cross section (free of deposits), no pores are observable, because the interspaces between WC particles were filled with bonding metals even after heat treatment.

In the lower cross section (showing white upward protuberances), migration (deposition) of the bonding metals to the substrate surface occurred together with rearrangement of WC particles, so that the bonding metals had their thicknesses reduced. Also, there were observed adjacent the deposits small pores which could not be filled during the rearrangement of WC particles. Namely, within at least about 30 μm deep in the surface regions of the substrates, the bonding metal content was reduced and hard crystalline particles 15 of WC were more closely spaced from one another than in deeper regions of the substrate, supposedly bringing the coefficient of thermal expansion of the WC substrate nearer to that of diamond so as to bring about a continuous gradient of such coefficient between the substrate and the coating.

Further, as shown in FIG. 4, nuclei of diamond crystals were not formed on the deposits, but diamond-like carbon was supposedly formed thereon, so that the film coating would not bond to the substrate there so strongly. This would contribute to relieving thermal stresses acting on the diamond films and the substrate.

Figure 8:
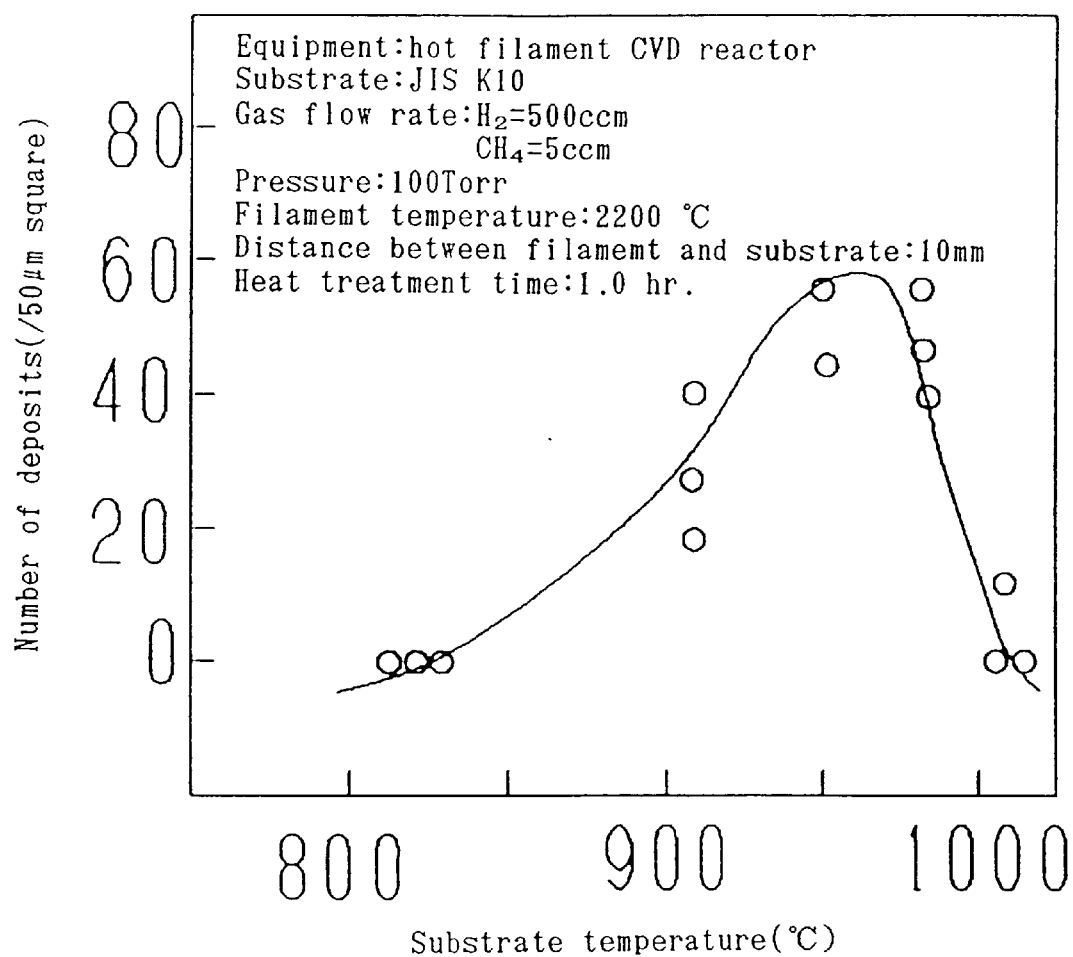
FIG. 8 is a graph plotting the quantity of deposits against the temperature of the substrate under heat treatment.

In the graph of FIG. 8, is shown the number of deposits formed on the surface of substrates heat-treated at varied substrate temperatures in hot filament CVD reactor under the following conditions: filament temperature 2,200° C.; gas composition $H_2$-1% $CH_4$ (gas flow rate: $H_2$ 500 cc/min., $CH_4$ 5 cc/min.); distance between hot filament and substrate 10 mm; treatment time 1 hr. As seen in FIG. 8, the number of deposits increased remarkably at substrate temperatures ranging from about 900° C. to about 990° C., with an abrupt decrease at temperatures exceeding about 1,000° C.

Figure 9:
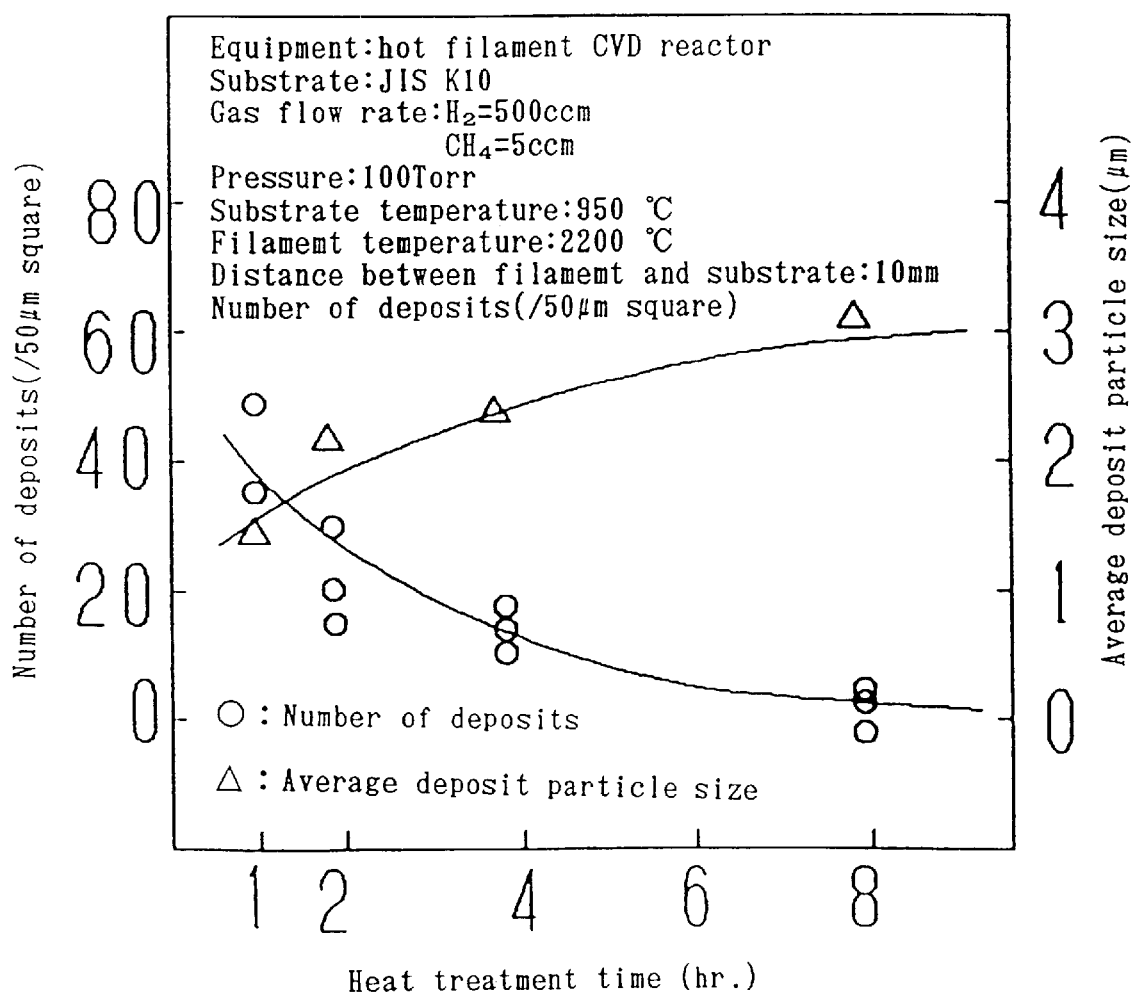
FIG. 9 is a graph plotting the quantity and size of deposits against the heat treatment time.

FIG. 9, is also shown a graph plotting the number and the particle size of deposits against heat treatment time in experiments made by using hot filament CVD reactor under the following conditions: substrate cemented carbide of JIS K10 (WC-6% Co); gas composition $H_2$-$CH_4$ (gas flow rate: $H_2$ 500 cc/min., $CH_4$ 5 cc/min., gas pressure 100 Torr); substrate temperature 950° C.; filament temperature 2,200° C.; distance between filament and substrate 10 mm.

As seen in the drawing, the number of formed deposits amounted to several tens per 50 μm square in 1 hour. As the heat treatment time became longer, the number of deposits became less, but their particle size increased.

Figure 10:
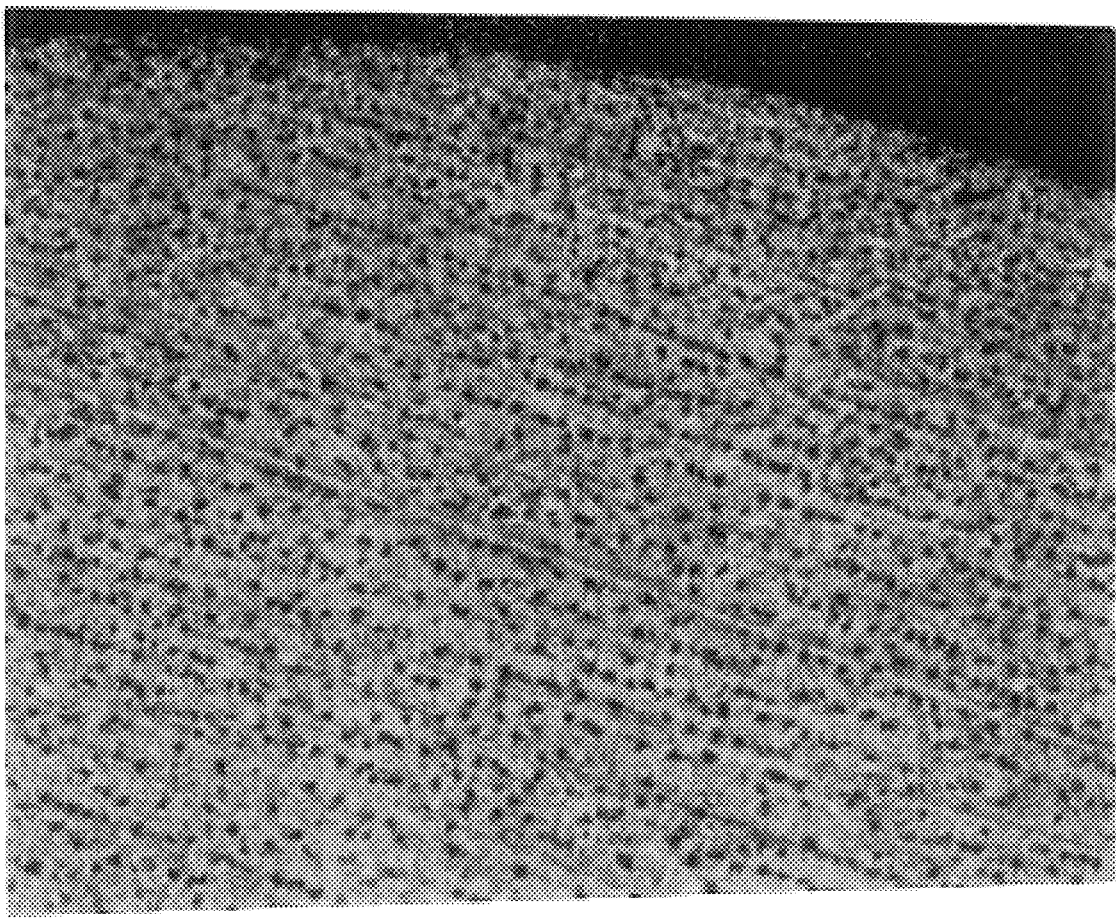
FIG. 10 is a photograph of a reflecting electron image of a scanning electron microscope, showing the surface of heat-treated cemented carbide substrate.

FIG. 10 is a photograph of a reflecting electron image of scanning electron microscope, showing the surface of the heat-treated cemented carbide substrate treated at 950° C. shown in FIG. 8. In such a reflecting electron image elements having larger atomic numbers are observed whiter, while those having smaller atomic numbers are observed darker. In the photograph of FIG. 10, blackpoints represent deposits, which are shown in an enlarged scale for analysis in FIG. 11a, b and c, with the deposits mainly composed of Co appearing darker, while the substrate surfaces composed of WC appearing whiter. FIG. 11a shows a secondary electron image of scanning electron microscope, lib an X-ray image of cobalt Kal, and 11c an X-ray image of tungsten Lal.

For 1% methane concentration optimum heat treatment temperature ranges from about 900° C. to 1,000° C., and 1 hour of treatment is sufficient to achieve formation of an acceptable quantity of deposits.

During heat treatment in the presence of methane gas flow, initially amorphous carbon begins to sediment on bonding metals on the substrate surface, where deposits also begin to be formed. If the heat treatment is continued further, the deposits will be covered with amorphous carbon. Since this state inhibits the growth of deposits, a cycle of heat treatment and soot removal is repeated a required number of times. As this cyclic process is repeated, the soot sedimentation decreases and diamond formation becomes remarkable on the substrate surface.

When heat treatment was conducted for 2 hours under the same conditions as given in FIG. 9, except that the atmosphere comprised only hydrogen gas without methane gas flow, scanning electron microscopy revealed an extreme reduction in the formation of deposits.

This fact suggests that efficient formation of deposits requires supply of carbon atoms.

Based on the fact that when the deposits are covered with amorphous carbon the growth of deposits stops, but it is restarted if the soot is removed, it would be concluded that the deposits require for their growth exposition to excitons such as thermoelectrons emitted from the hot filament.

However, when the substrate was heated to 1,300° C. in an indirect heating type vacuum oven ($5 \times 10^{-3}$ Torr) with a smaller quantity of excitons, formation of deposits was observed.

This fact suggests that existence of excitons together with the presence of carbon atoms facilitates migration of bonding metals from the inside to the surface of the substrate. In the course of such migration, the substrate surface and the deposits would be polluted with the carbonaceous atmosphere and residual gases in the atmosphere, which supposedly causes the migrated bonding metals to grow into hemispherical deposits.

When the substrate was subjected to heat treatment under 100 Torr conditions relatively susceptible to plasma generation in which the substrate was exposed to thermoelectrons, deposit formation were observed at about 900° C., but the temperature at which the deposits are formed would become higher if a heating oven with a smaller quantity of excitons was used. Therefore, to assure efficient formation of deposits, it is preferred to use as a heat treatment equipment a hot filament CVD reactor, although high-energy heating and other heating systems may be used, including microwave, laser beam heating systems, and the like.

Cutting test (7)

Figure 12:
FIGS. 12 and 13 are photographs of secondary electron images of a scanning electron microscope after cutting test, showing the cutting edges of a commercially available cutting tool and a cutting tool according to the present invention, respectively.

FIG. 12 is a photograph of a secondary electron image of a scanning electron microscope, showing a diamond-coated cutting edge of a commercially available cutting tool after cutting a work of aluminium alloy (Al-18% Si) over a length of about 500 m. As seen in the photograph, the film coating was delaminated after cutting of this 500 m length of the work. The coating thickness is as small as about 10 μm or less, so that the grinding mark on the substrate surface can be observed on the diamond film.

Figure 13:
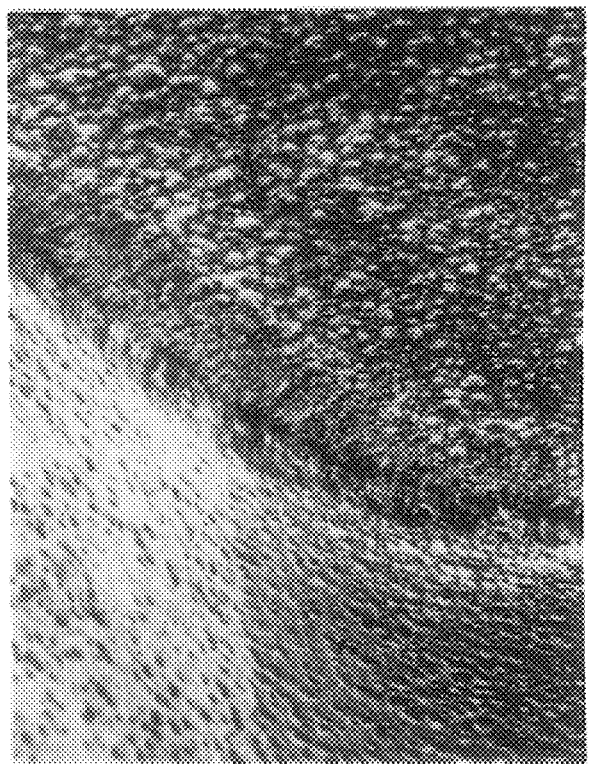

FIG. 13 is a photograph of a secondary electron image of scanning electron microscope, showing a preferred tip of a cutting tool according to the present invention after cutting a work of the same material as above over a length of about 3,500 m, the tip being formed by repeating 3 times the 1.5 hour heat treatment under conditions shown in FIG. 9, followed by film formation in a $H_2$-1% $CH_4$ atmosphere over 15 hours with the substrate temperature kept at 850° C. As seen in the photograph, no delamination occurred, with a slight wear observed on the flank. Also, the film coating thickness was significantly large, so that no grinding mark on the substrate surface could be observed.

Figure 14:
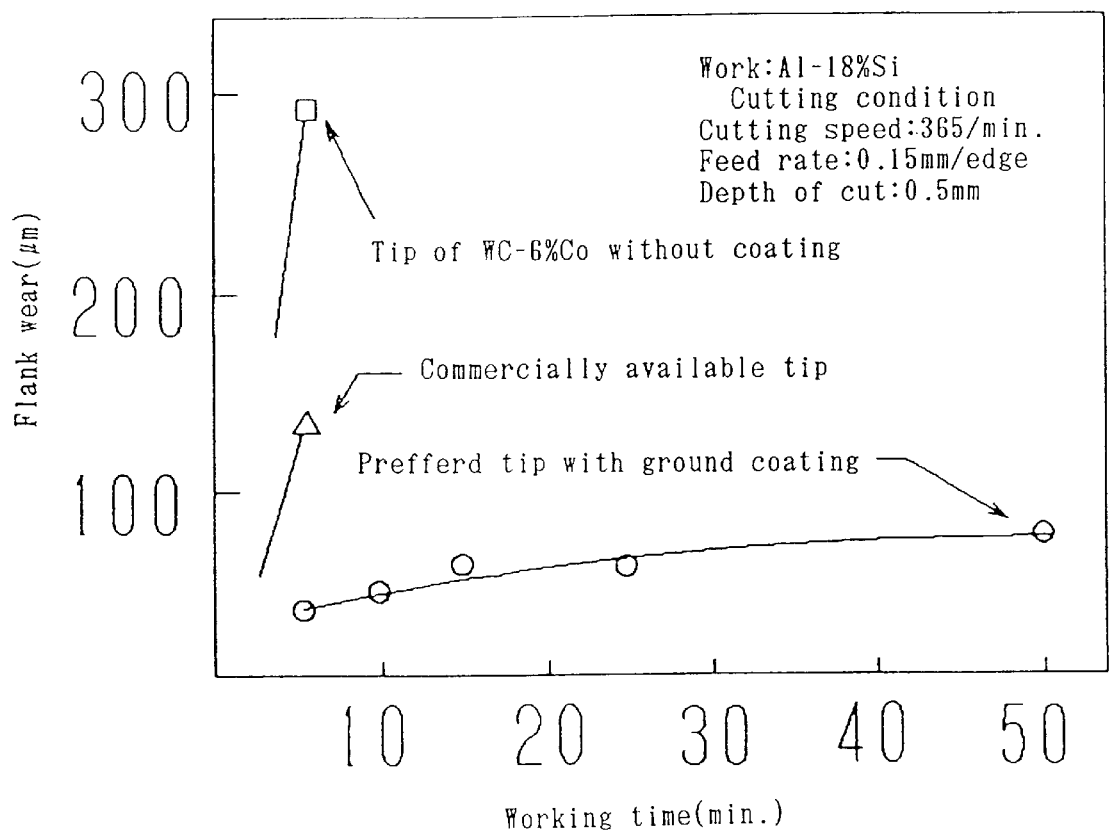
FIGS. 14, 15, 16 and 17 are graphical charts showing the results of cutting tests made by using cutting tools of comparative examples and those embodying the present invention.

FIG. 14 shows results of cutting tests made on the same cutting tool as that used in the experiment associated with FIG. 13 above, with the tip having its rake face and flank ground. In the tip, the film was grown to about 25 μm thickness, followed by grinding down to 15 μm thickness. In this test of which results are given in FIG. 14, the same commercially available cutting tool as that used in the experiment associated with FIG. 12 and a cutting tool with a tip formed of a substrate of the aforementioned third group without diamond film coating were used as comparative examples.

Figure 15:
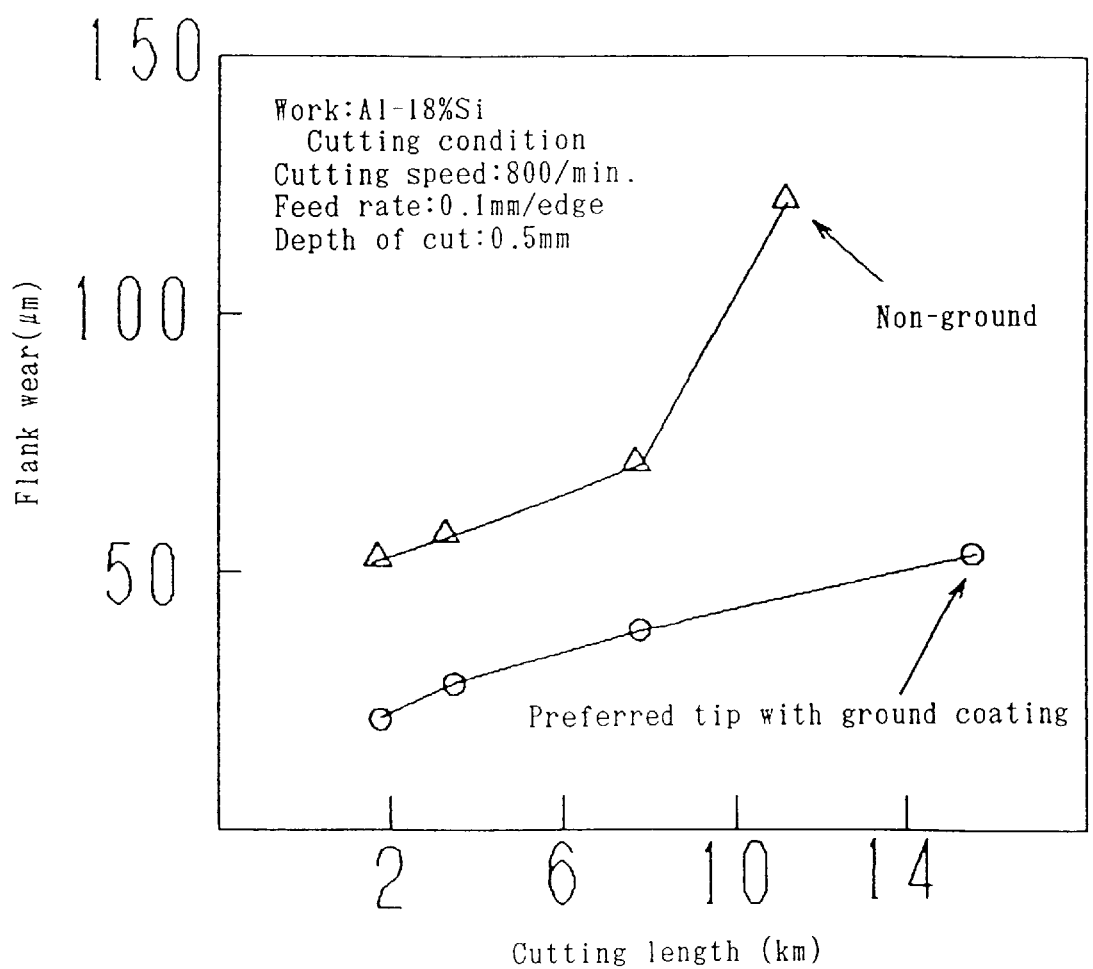

FIG. 15 shows in a graph of the drilling performance of the ground tip used in the foregoing test shown in FIG. 14 above as compared with the performance of a non-ground tip formed of the same diamond-coated material as the ground tip, with the ground tip showing a remarkable reduction in its flank wear.

Figure 16:
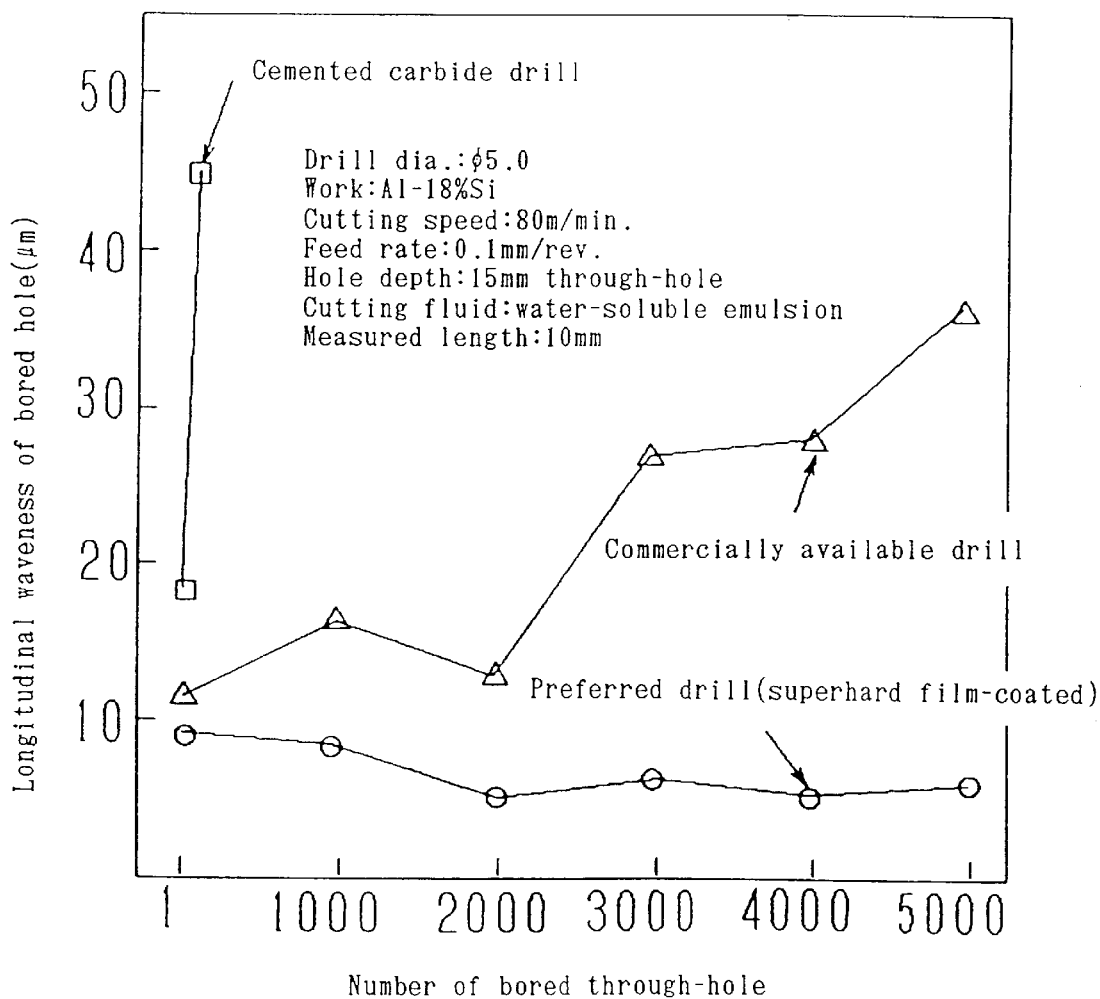

FIG. 16 is a graph showing the cutting performance of a preferred drill of the present invention formed of the diamond-coated member used in the test associated with FIG. 15 above, as compared with those of a drill formed of the cemented carbide material used for said diamond-coated member and of a commercially available diamond-coated drill.

Figure 17:
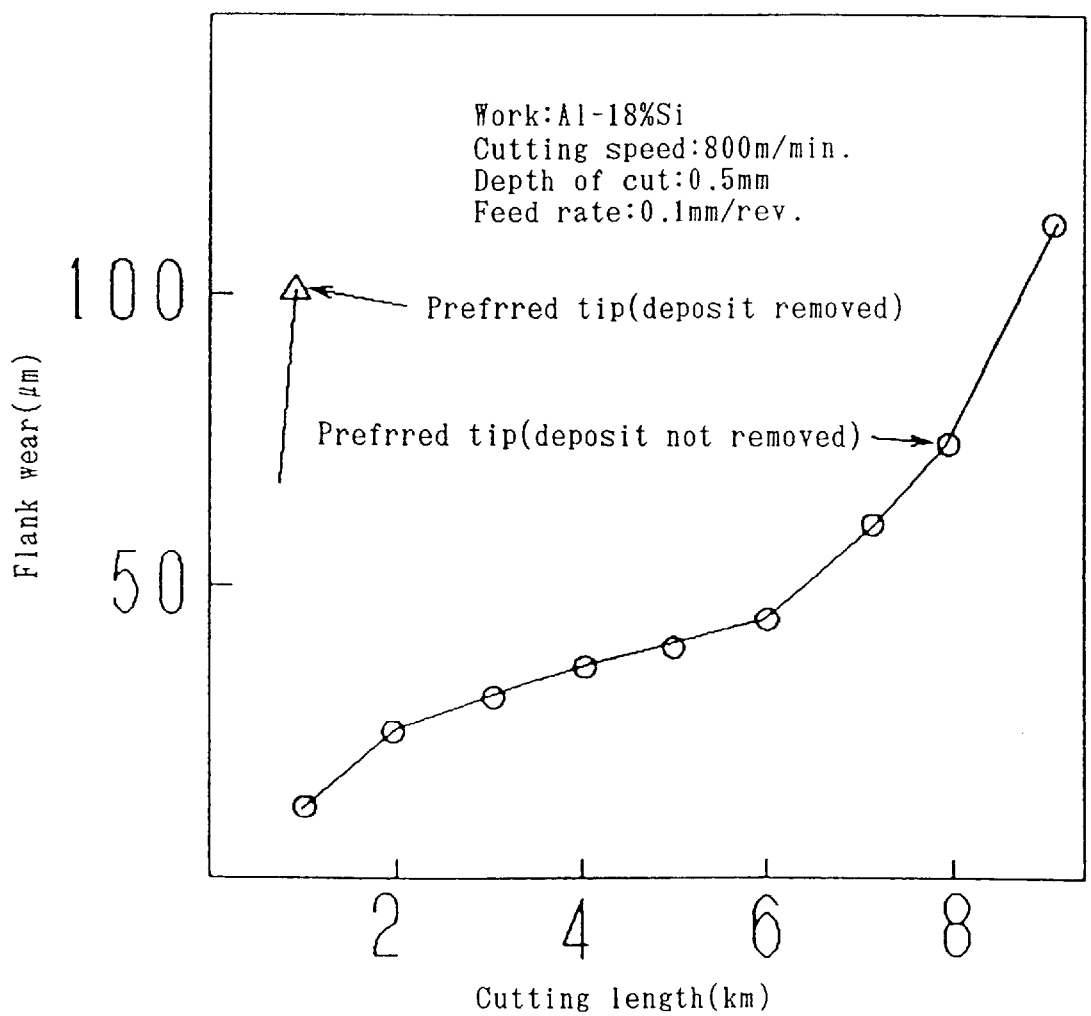

FIG. 17 shows the cutting performance of a tool having the non-ground tip described with reference to FIG. 14 as compared with a tool having a tip formed of a material obtained by the heat treatment described with reference to FIG. 14 above, followed by removal deposits and formation of diamond film about 10 μm thick.

Figure 18:
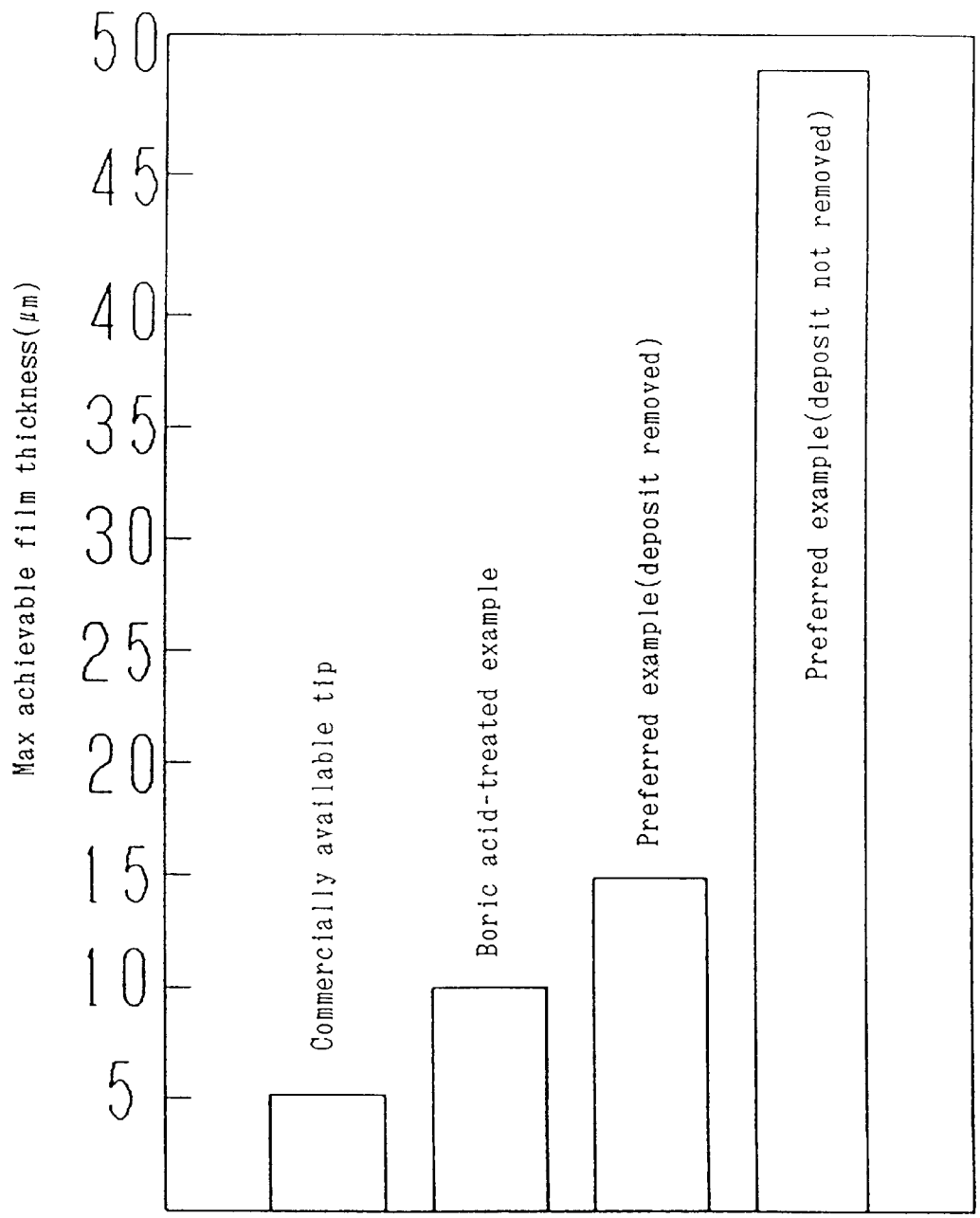
FIG. 18 is a chart showing the thicknesses of superhard films achievable with the methods of comparative examples and the present invention, respectively.

FIG. 18 shows a chart comparing maximum coating thicknesses achievable in the preferred examples, an intentionally prepared comparative example and a prior art comparative example.

In the specimens in which coating was provided without removing deposits, cobalt was found in the diamond film within a region on the side of the interface between the diamond film and the substrate, so that delamination of the film due to a difference in the coefficient of thermal expansion between the film and the substrate was prevented more effectively, as described previously. Although such a desirable effect will not be achieved with superhard film-coated cemented carbides formed by removing deposits, such cemented carbides according to the present invention are far superior to commercially available products according to the prior art.

In experiments associated with the chart of FIG. 18, a commercially available diamond-coated tip has its coating thickness measured as one comparative example. As the other comparative example, a cemented carbide substrate asused for the present invention was immersed in a boric acid solution and subsequently subjected to film formation.

In the preferred example prepared without removing the deposits, diamond film is formed in the presence of the deposits. The resultant inclusion of the deposits as trace in the diamond film would be effectively combined with the continuous gradient of such coefficient between the substrate and the coating due to reduced bonding metal content in the surface region of the cemented carbide substrate caused by migration of the bonding metals therefrom. As a result, a synergetic effect of allowing formation of thicker film with a high bonding strength is achieved.

In the preferred example prepared by removing the deposits, only the effect of migration to reduce the bonding metal content in the surface region of the substrate is observed, but such a preferred example is superior, in coating thickness and bonding strength, to both the prior art and boric acid-treated comparative examples.

Industrial Applicability

As described fully hereinbefore, the present invention provides a superhard film coated member by enabling formation, on a cemented carbide substrate, of thicker diamond films having a high bonding strength in a chemical vapor deposition process. The present superhard film-coated member has many applications including wear resistant cutting tools, wear resistant parts and components. Further, the present invention provides an applicability to industrial production and an economical advantage, in that for the manufacture of the products, the heat treatment and film formation processes are both performed by using the same CVD reactor.

We claim:

1. A superhard film-coated member comprising:
   a cemented carbide substrate comprising tungsten carbide particles and a bonding metal, said cemented carbide substrate having:
      a surface;
      a first region defined between said surface and a depth of about 30 μm deep from said surface; and
      a second region which is distal to said surface in relation to said first region; and
   a hard film of diamond, said hard film having a surface which interfaces with said surface of said substrate,
   wherein said first region has narrower interparticle spaces between said tungsten carbide particles contained therein and a lower content of said bonding metal than in said second region.

2. A superhard film-coated member according to claim 1, wherein said hard film has a thickness and contains said bonding metals of said cemented carbide substrate in a region defined between said surface of said hard film and a depth of about half of said thickness.

3. A superhard film-coated member according to claim 1 or 2, wherein the surface of said superhard film is finished by grinding.

4. A method of manufacturing a superhard film-coated member, said method comprising:
   heat treating a surface of a cemented carbide substrate to form hemispherical deposits substantially composed of bonding metals on the surface of the substrate; and forming a hard film on the surface of the substrate, the hard film being formed from a material selected from the group consisting of diamond and diamond-like carbon.

5. A method according to claim 4, wherein said step of heat-treating the surface of the cemented carbide substrate is performed in an atmosphere containing carbon atoms for forming sediments substantially composed of carbon and hemispherical deposits, and further comprising the step of removing at least the sediments which are formed on the surface.

6. A method according to claim 5, further comprising repeating said heat-treating and removing steps.

7. A method according to claim 4, wherein said step of heat-treating the surface of the cemented carbide substrate is performed in an atmosphere containing hydrogen atoms or under low vacuum for forming the hemispherical deposits and sediments substantially composed of carbon.

8. A method according to any one of the preceding claims 4 through 7, wherein said heat treating step is preformed in a hot-filament CVD reactor.

9. A method according to claim 8, wherein said step of heat-treating the surface of the cemented carbide substrate is preformed in a range of 500° C. to 1300° C.

10. A method according to claim 8, wherein said step of heat-treating the surface of the cemented carbide substrate is preformed at a temperature of at least 500° C.

11. A method according to any one of claims 4–7, wherein said step of heat-treating the surface of the cemented carbide substrate is preformed in a range of 500° C. to 1300° C.

12. A method according to any one of claims 4–7, wherein said step of heat-treating the surface of the cemented carbide substrate is preformed at a temperature of at least 500° C.

13. A superhard film-coated member comprising:

a cemented carbide substrate comprising tungsten carbide particles and a bonding metal, said cemented carbide substrate having:

a surface;

a first region defined between said surface and a depth of about 30 $\mu$m deep from said surface; and a second region which is distal to said surface in relation to said first region; and a hard film of diamond-like carbon, said hard film having a surface which interfaces with said surface of said substrate, wherein said first region has narrower interparticle spaces between said tungsten carbide particles contained therein and a lower content of said bonding metal than in said second region.

14. A superhard film-coated member according to claim 13, wherein said hard film of diamond-like carbon includes diamond.

15. A superhard film-coated member according to claim 13, wherein said hard film has a thickness and contains said bonding metals of said cemented carbide substrate in a region defined between said surface of said hard film and a depth of about half of said thickness.

16. A superhard film-coated member according to claim 13, wherein the surface of said superhard film is finished by grinding.

* * * * *